US012363898B2

(12) United States Patent
Wu et al.

(10) Patent No.: US 12,363,898 B2
(45) Date of Patent: Jul. 15, 2025

(54) 3D NAND MEMORY DEVICE WITH NON-UNIFORM CHANNEL STRUCTURE AND METHOD FOR FORMING THE SAME

(71) Applicant: Yangtze Memory Technologies Co., Ltd., Hubei (CN)

(72) Inventors: LinChun Wu, Wuhan (CN); Wenxi Zhou, Wuhan (CN); Zhiliang Xia, Wuhan (CN); ZongLiang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 545 days.

(21) Appl. No.: 17/647,053

(22) Filed: Jan. 5, 2022

(65) Prior Publication Data

US 2023/0135326 A1  May 4, 2023

Related U.S. Application Data

(63) Continuation of application No. PCT/CN2021/127760, filed on Oct. 30, 2021.

(51) Int. Cl.
*H10B 43/27* (2023.01)
*H10B 43/10* (2023.01)
(Continued)

(52) U.S. Cl.
CPC ............ *H10B 43/27* (2023.02); *H10B 43/10* (2023.02); *H10B 43/35* (2023.02); *H10B 43/40* (2023.02)

(58) Field of Classification Search
CPC ........ H10B 43/27; H10B 43/10; H10B 43/35; H10B 43/40; H01L 24/82; H01L 25/18
See application file for complete search history.

(56) References Cited

U.S. PATENT DOCUMENTS 7,511,372 B2 * 3/2009 Chiu ..................... H01L 23/473
257/706
8,952,426 B2 * 2/2015 Maejima ........... H01L 29/42344
257/214
(Continued)

FOREIGN PATENT DOCUMENTS

CN 111801800 A 10/2020
CN 112951841 A 6/2021
(Continued)

OTHER PUBLICATIONS

International Search Report issued on Jul. 29, 2022 in PCT/CN2021/127760, 5 pages.
(Continued)

*Primary Examiner* — Caleb E Henry
(74) *Attorney, Agent, or Firm* — Oblon, McClelland, Maier & Neustadt, L.L.P.

(57) ABSTRACT

Aspects of the disclosure provide a semiconductor device including a first die. The first die includes a first stack of layers including a semiconductor layer on a backside of the first die. A second stack of layers is formed that includes gate layers and first insulating layers alternatingly stacked on a face side of the first die. The face side is opposite to the backside. A vertical structure includes a first portion disposed in the first stack of layers and a second portion extending through the second stack of layers. The first portion has a different dimension than the second portion in a direction parallel to a main surface of the first die.

20 Claims, 9 Drawing Sheets

(51) Int. Cl.
  *H10B 43/35*     (2023.01)
  *H10B 43/40*     (2023.01)

(56) References Cited

U.S. PATENT DOCUMENTS

| | | | |
|---|---|---|---|
| 9,287,271 B2* | 3/2016 | Wang | H10B 12/053 |
| 9,437,606 B2* | 9/2016 | Makala | H10B 43/27 |
| 9,508,730 B2* | 11/2016 | Lee | H10N 70/25 |
| 9,576,973 B2* | 2/2017 | Lee | H01L 29/40117 |
| 9,613,689 B1 | 4/2017 | Takaki | H01L 23/528 |
| 9,679,907 B1* | 6/2017 | Kaneko | H10B 43/35 |
| 9,875,929 B1* | 1/2018 | Shukla | H01L 29/40117 |
| 10,141,221 B1* | 11/2018 | Lai | H01L 21/76831 |
| 10,163,924 B2* | 12/2018 | Ahn | H10B 41/27 |
| 10,217,746 B1* | 2/2019 | Kim | H10B 43/35 |
| 10,290,648 B1* | 5/2019 | Zhou | H10B 43/27 |
| 10,381,443 B2* | 8/2019 | Matsumoto | H10B 41/41 |
| 10,510,738 B2* | 12/2019 | Kim | H01L 24/80 |
| 10,515,897 B2* | 12/2019 | Nishikawa | H10B 43/35 |
| 10,515,907 B2* | 12/2019 | Fujita | H10B 43/27 |
| 10,522,624 B2* | 12/2019 | Van Houdt | H01L 29/1037 |
| 10,559,582 B2* | 2/2020 | Nishikawa | H10B 43/27 |
| 10,777,539 B2* | 9/2020 | Chu | H01L 23/481 |
| 11,563,021 B2* | 1/2023 | Huang | H10B 43/35 |
| 2013/0037950 A1* | 2/2013 | Yu | H01L 23/5226 257/E23.021 |
| 2016/0268263 A1* | 9/2016 | Lee | H10B 43/10 |
| 2016/0365352 A1* | 12/2016 | Nishikawa | H01L 23/5226 |
| 2017/0053906 A1* | 2/2017 | Or-Bach | H01L 27/1027 |
| 2017/0162597 A1* | 6/2017 | Sharangpani | H01L 29/40117 |
| 2017/0213845 A1* | 7/2017 | Baba | H10B 43/27 |
| 2017/0236836 A1* | 8/2017 | Huo | H01L 28/00 257/324 |
| 2018/0122904 A1 | 5/2018 | Matsumoto et al. | |
| 2018/0122906 A1 | 5/2018 | Yu et al. | |
| 2018/0277556 A1* | 9/2018 | Kang | H10B 43/10 |
| 2018/0342557 A1* | 11/2018 | Mori | H10N 70/823 |
| 2019/0074290 A1* | 3/2019 | Xiao | H10B 43/10 |
| 2019/0355735 A1* | 11/2019 | Kothari | H10B 41/27 |
| 2020/0051904 A1* | 2/2020 | Tang | H10N 70/8822 |
| 2020/0126974 A1* | 4/2020 | Liu | H01L 23/3114 |
| 2020/0350203 A1* | 11/2020 | Fratin | G11C 5/063 |
| 2020/0388650 A1* | 12/2020 | Nardi | H10N 70/8613 |
| 2020/0395407 A1* | 12/2020 | Takahashi | H10N 70/066 |
| 2020/0395408 A1* | 12/2020 | Takahashi | H10B 63/845 |
| 2020/0402988 A1* | 12/2020 | Howder | H10B 43/27 |
| 2020/0403033 A1* | 12/2020 | Lilak | H10B 43/50 |
| 2021/0036002 A1 | 2/2021 | Lee | |
| 2021/0217768 A1 | 7/2021 | Fukuzumi et al. | |
| 2021/0265364 A1* | 8/2021 | Huang | H10B 43/27 |

FOREIGN PATENT DOCUMENTS

| | | |
|---|---|---|
| CN | 113169184 A | 7/2021 |
| JP | 2016-62901 A | 4/2016 |
| JP | 2021-40125 A | 3/2021 |
| KR | 10-2015-0134494 | 12/2015 |

OTHER PUBLICATIONS

Extended European Search Report issued on Jun. 20, 2024 in the corresponding European Application No. 21961971.5, 8 pages.

Japanese Office Action issued on Sep. 2, 2024 in the corresponding Japanese Patent Application No. 2023-557777, 7 pages.

Office Action dated Jan. 7, 2025, issued in Japanese application No. 2023-557777, with computer-generated English translation.

Ofice Action issued on Nov. 11, 2024, in Korean Patent Application No. 10-2023-7030654 filed Sep. 7, 2023, 13 pages.

Office Action dated Apr. 30, 2025, issued in Japanese Patent Application No. 2023-557777 (with computer-generated English translation).

* cited by examiner

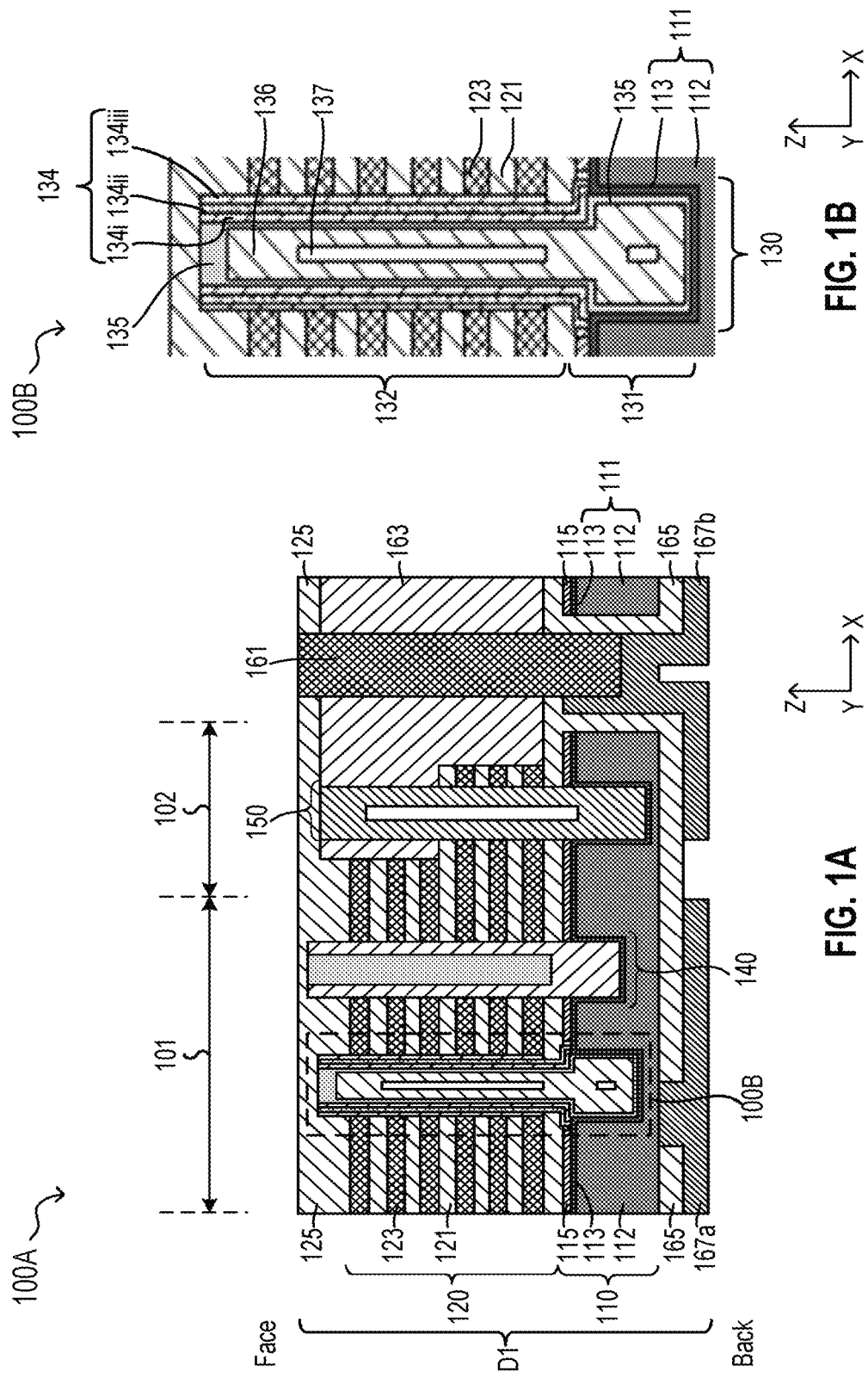

12
3D NAND MEMORY DEVICE WITH NON-UNIFORM CHANNEL STRUCTURE AND METHOD FOR FORMING THE SAME

RELATED APPLICATION

This application is a bypass continuation of International Application No. PCT/CN2021/127760, filed on Oct. 30, 2021. The entire disclosure of the prior application is hereby incorporated by reference in its entirety.

TECHNICAL FIELD

The present application describes embodiments generally related to semiconductor memory devices, and methods for forming the semiconductor memory devices.

BACKGROUND

Semiconductor manufacturers have developed vertical device technologies, such as three dimensional (3D) NAND flash memory technology and the like, to achieve higher data storage density without requiring smaller memory cells. In some examples, a 3D NAND memory device includes a core region (also known as an array region) and a staircase region. The core region includes an array of channel structures extending through a stack of gate layers and insulating layers. The gate layers and the channel structures can form vertical NAND memory cell strings. The staircase region is used to form connections to control the vertical NAND memory cell strings.

SUMMARY

Aspects of the disclosure provide a semiconductor device and a method of forming the same.

According to a first aspect, a semiconductor device is provided. The semiconductor device includes a first die. The first die includes a first stack of layers including a semiconductor layer on a backside of the first die. A second stack of layers is formed that includes gate layers and first insulating layers alternatingly stacked on a face side of the first die. The face side is opposite to the backside. A vertical structure includes a first portion disposed in the first stack of layers and a second portion extending through the second stack of layers. The first portion has a different dimension than the second portion in a direction parallel to a main surface of the first die.

In some embodiments, the vertical structure includes a channel structure in a core region. The channel structure includes a channel layer extending in the first portion and the second portion. In some embodiments, the second portion includes a tunneling layer surrounding the channel layer, a charge trapping layer surrounding the tunneling layer, and a barrier layer surrounding the charge trapping layer. In some embodiments, the channel layer, in the first portion, is in contact with the semiconductor layer.

In some embodiments, a first lateral periphery of the first portion extends from a second periphery of the second portion by 10-100 nm.

In some embodiments, the first portion has a larger dimension than the second portion in the direction parallel to the main surface of the first die.

In some embodiments, the semiconductor device further includes a first conductive structure disposed on the backside of the first die. The first conductive structure is conductively connected with the semiconductor layer. A second conductive structure is disposed on the backside of the first die. The second conductive structure is conductively connected with a contact structure disposed on the face side of the first die.

In some embodiments, the vertical structure includes at least one of a gate line slit (GLS) structure or a dummy channel structure.

In some embodiments, the semiconductor device further includes memory cells on the face side of the first die. A second die is bonded with the first die face to face. The second die includes a substrate and peripheral circuitry formed on a face side of the substrate for the memory cells.

According to a second aspect of the disclosure, a memory system includes a semiconductor device having a die. The die includes a first stack of layers including a semiconductor layer on a backside of the die. A second stack of layers includes gate layers and insulating layers alternatingly stacked on a face side of the die. The face side is opposite to the backside. A vertical structure includes a first portion disposed in the first stack of layers and a second portion extending through the second stack of layers. The first portion has a different dimension than the second portion in a direction parallel to a main surface of the die. The memory system also includes a controller configured to control operations of the semiconductor device. The controller is connected with the semiconductor device.

According to a third aspect of the disclosure, a method for fabricating a semiconductor device is provided. The method includes forming etch stop structures in an initial first stack of layers including a sacrificial semiconductor layer over a first substrate. The etch stop structures extend into the sacrificial semiconductor layer. A second stack of layers is formed over the initial first stack of layers. Holes are formed that extend through the second stack of layers. A hole exposes a respective etch stop structure that has a different dimension than the hole in a direction parallel to a main surface of the first substrate. The respective etch stop structures are removed via the holes so that the holes extend into the sacrificial semiconductor layer. Vertical structures are formed in the holes. In some embodiments, the first portion has a larger dimension than the second portion in the direction parallel to the main surface of the first substrate.

In some embodiments, the etch stop structures have different etching properties from the second stack of layers. The etch stop structures have different etching properties from the sacrificial semiconductor layer.

In some embodiments, the vertical structures include a channel structure. The forming the vertical structures includes forming second insulating layers on exposed surfaces along a channel hole. A channel layer is formed along the second insulating layers.

In some embodiments, the first substrate of a first die and the sacrificial semiconductor layer are removed from a backside of the first die so that the channel structure is exposed from the backside of the first die. Exposed portions of the second insulating layers are removed so that the channel layer is exposed from the backside of the first die. A semiconductor layer is formed that covers the channel structure from the backside of the first die. A first conductive structure is formed that is conductively connected to the semiconductor layer. A contact structure is formed from a face side of the first die. The face side is opposite to the backside. A second conductive structure is formed from the backside of the first die. The second conductive structure is conductively connected to the contact structure In some embodiments, each channel structure is formed using a respective etch stop structure.

In some embodiments, the second stack of layers includes sacrificial gate layers and first insulating layers alternatingly stacked over the initial first stack of layers. Dummy channel structures are formed in a staircase region. Gate line (GL) cut trenches are formed that extend through the second stack of layers. The sacrificial gate layers are replaced with gate layers via the GL trenches. Gate line slit (GLS) structures are formed in the GL cut trenches.

In some embodiments, the forming the vertical structures includes forming at least one of the dummy channel structures or the GLS structures.

In some embodiments, the first substrate is included by a first die. Peripheral circuitry is formed on a face side of a second die. The first die and the second die are bonded face to face.

According to a fourth aspect of the disclosure, a method for fabricating a semiconductor device is provided. The method includes forming a first stack of layers that includes a semiconductor layer on a backside of a first die. A second stack of layers is formed that includes gate layers and first insulating layers alternatingly stacked on a face side of the first die. The face side is opposite to the backside. A channel structure is formed that includes a first portion disposed in the first stack of layers and a second portion extending through the second stack of layers. The first portion has a larger dimension than the second portion in a direction parallel to a main surface of the first die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 1A shows a vertical cross-sectional view of a semiconductor device, in accordance with exemplary embodiments of the present disclosure.

FIG. 1B shows an expanded view of the box 100B in FIG. 1A, in accordance with exemplary embodiments of the present disclosure.

DETAILED DESCRIPTION

Figure 1C:
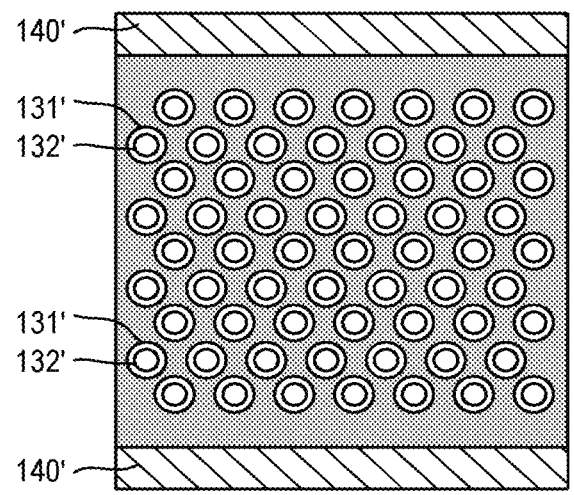
FIG. 1C shows a layout design of the semiconductor device in FIG. 1A, in accordance with exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some aspects of the disclosure, vertical structures, such as channel structures in three dimensional (3D) NAND flash memory devices and the like, are formed in holes that are etched into a semiconductor layer by a front side processing. The etching process to form the holes into the semiconductor layer can affect a depth uniformity of the holes into the semiconductor layer. When the depth uniformity of the holes is low, the uniformity of the end profile of the vertical structures in the semiconductor layer is poor. Some semiconductor technologies use backside processing to form structures, such as connection structures, at a backside of a semiconductor device. In some examples, the semiconductor layer can be removed by a backside processing, and further backside processing can be performed. The poor uniformity of the end profile of the vertical structures can cause difficulty for the backside processing.

The present disclosure provides a method to form vertical structures with well-controlled profiles including a sidewall profile and an end profile. Techniques herein include forming an etch stop structure below a future vertical structure. In some examples, the etch stop structure has a larger dimension than the future vertical structure in a horizontal direction so that a hole (for the future vertical structure) can be formed on top of the etch stop structure with some tolerance for alignment error. The etch stop structure can include a material which has etch selectivity so that a process of etching the hole can be stopped at the etch stop structure without causing much gouging or poor uniformity. The etch stop structure is then removed via the hole, and further processes may be executed, for example to form the vertical structure in the hole.

According to some aspects of the disclosure, a plurality of etch stop structures can be formed below various future vertical structures. In some embodiments, an etch stop structure is formed below a future channel structure to provide a controlled etch profile for a corresponding channel hole. In some embodiments, an etch stop structure is formed below a future gate line slit (GLS) structure to provide a controlled etch profile for a corresponding gate line (GL) cut trench. In some embodiments, an etch stop structure may be formed below a dummy channel structure to provide a controlled etch profile for a corresponding dummy channel hole.

According to some aspects of the present disclosure, a pattern of the etch stop structures can be included in an alignment mask that is the first mask to form alignment structures that can be used for alignment by later masks. Hence, no extra mask is needed.

FIG. 1A shows a vertical cross-sectional view of a semiconductor device 100A, in accordance with exemplary embodiments of the present disclosure. FIG. 1B shows an expanded view of the box 100B in FIG. 1A, in accordance with exemplary embodiments of the present disclosure. FIG. 1C shows some layers in a layout design 100C for the semiconductor device 100A in FIG. 1A, in accordance with exemplary embodiments of the present disclosure. Note that a channel structure is used herein as an example of the vertical structures for illustration purposes.

As shown in FIGS. 1A-1B, the semiconductor device 100A includes a first die D1. The first die D1 includes a first stack 110 of layers including a semiconductor layer 111 on a backside of the first die D1. The first die D1 also includes a second stack 120 of layers including gate layers 123 and first insulating layers 121 alternatingly stacked on a face side of the first die D1. The face side is opposite to the backside. The first die D1 further includes channel structures 130 disposed in a core region 101 (also referred to as an array region). A channel structure 130 can include a first portion 131 disposed in the first stack 110 of layers and a second portion 132 extending through the second stack 120 of layers. The first portion 131 of the channel structure 130 has a larger dimension than the second portion 132 of the channel structure 130 in a direction parallel to a main surface of the first die D1 (e.g. the XY plane). For example, the first portion 131 can be wider than the second portion 132 in the X direction in the XZ cross section as shown in FIG. 1B. Further, the first portion 131 may be wider than the second portion 132 in any direction in the XY plane such that the first portion 131 extends horizontally beyond the second portion 132. For example, a first lateral periphery of the first portion 131 can extend from a second periphery of the second portion 132 by 10-100 nm.

In some embodiments, the second portion 132 of the channel structure 130 includes a channel layer 135 (e.g. polysilicon) and second insulating layers 134 surrounding the channel layer 135. For example, the second insulating layers 134 can include a tunneling layer 134i (e.g. silicon oxide) surrounding the channel layer 135, a charge trapping layer 134ii (e.g. silicon nitride) surrounding the tunneling layer 134i, and a barrier layer 134iii (e.g. silicon oxide) surrounding the charge trapping layer 134ii.

In some embodiments, the first portion 131 of the channel structure 130 includes the channel layer 135 that is surrounded by the semiconductor layer 111 (e.g. polysilicon) and covered by the semiconductor layer 111 from the backside of the first die D1. As a result, the first portion 131 is in contact with and conductively connected with the semiconductor layer 111. In some embodiments, the semiconductor layer 111 is configured to function as a source connection layer that connects the channel layer 135 to an array common source (ACS). In one example, the semiconductor layer 111 includes a bulk portion 112 and a liner portion 113 (e.g. a conformal portion). The liner portion 113 is in contact with the channel layer 135 and may have a different doping profile from the bulk portion 112. In another example, the semiconductor layer 111 only includes the bulk portion 112 which is in contact with the channel layer 135.

In some embodiments, the channel structure 130 may further include a dielectric layer 136 located inside and surrounded by the channel layer 135. The dielectric layer 136 may include one or more voids 137.

In some embodiments, the first portion 131 of the channel structure 130 has a lateral dimension of 80-200 nm in a direction parallel to the main surface of the first die D1 (e.g. the XY plane) and a thickness of 10-500 nm in a direction (e.g. the Z direction) perpendicular to the main surface of the first die D1. The second portion 132 can have a lateral dimension of 60-150 nm in the direction parallel to the main surface of the first die. In addition, the first portion 131 and the second portion 132 can have various shapes. For example, the first portion 131 and the second portion 132 may have a circular, elliptical or polygonal shape in the XY plane and a pillar shape in the XZ plane and in the YZ plane.

FIG. 1C shows layout patterns 131' corresponding to the first portion 131 of the channel structures 130, and layout patterns 132' corresponding to the second portion 132 of the channel structures. In some examples, a lateral periphery of the layout patterns 131' extends from a lateral periphery of the layout patterns 132' by a layout size corresponding to 10 nm to 100 nm of real product size (e.g. the semiconductor device 100A).

In some embodiments, the second stack 120 of gate layers 123 and first insulating layers 121 and channel structures 130 can form a stack of transistors, such as an array of vertical memory cell strings. In some embodiments, the stack of transistors can include memory cells stacked in the Z direction on the face side of the first die D1. In some embodiments, the stack of transistors can also include select transistors, such as one or more bottom select transistors, one or more top select transistors, and the like. In some embodiments, the stack of transistors can further include one or more dummy select transistors.

Still referring to FIGS. 1A-1B, the first die D1 can also include a plurality of gate line slit (GLS) structures 140 (also referred to as gate line cut structures in some examples) extending through the second stack 120 of layers. FIG. 1C shows layout patterns 140' corresponding to the GLS structures 140. The GLS structures 140 can be used to facilitate replacement of sacrificial layers with the gate layers 123 in a gate-last process. In one embodiment (not shown), a GLS structure 140 may include a semiconductor material (not shown) and be configured to function as an ACS. The ACS is conductively connected to the channel layers 135 via a source connection layer, such as the semiconductor layer 111.

In another embodiment as shown in FIG. 1A, a GLS structure 140 includes one or more dielectric materials. In some examples, the GLS structure 140 extends through the second stack 120 of layers, and the GLS structure 140 is configured to divide the vertical memory cell strings (corresponding to the channel structures 130) into separate blocks. In some examples, the vertical memory cell strings are configured to be erased by block. Further, the quantity and arrangement of the channel structures 130 between the GLS structures 140 can vary.

In the example of FIG. 1A, the GLS structure 140 is shown with a continuous sidewall profile. In another example (not shown), the GLS structure 140 can have a similar configuration to the channel structure 130. That is, the GLS structure 140 can include a first portion disposed in the first stack 110 of layers and a second portion extending through the second stack 120 of layers. The first portion of the GLS structure 140 may have a larger dimension than the second portion of the GLS structure 140 in a direction parallel to the main surface of the first die D1. Thus, the sidewall of the first portion has a larger perimeter than the second portion.

In some embodiments, the first die D1 includes a staircase region 102 where pairs of the gate layers 123 and the first insulating layers 121 are arranged in a form of stair steps, for example one pair of the first insulating layer 121 and the gate layer 123 per stair step. Gate contact structures (not shown) can therefore be disposed on the stair steps and be connected to the respective gate layers 123. The gate contact structures are used to connect driving circuitry to the respective gate layers 123 to control the stacked memory cells and select gates.

In some embodiments, the first die D1 further includes a plurality of dummy channel structures 150. The plurality of dummy channel structures 150 can prevent the second stack 120 of layers from collapsing during a replacement of sacrificial layers with the gate layers 123 in a gate-last process. The dummy channel structures 150 can include one or more dielectric materials. In one example, arrays of dummy channel structures 150 can be disposed in the staircase region 102 between the GLS structures 140. In another example, one or more dummy channel structures 150 can also be disposed in the core region 101.

In the example of FIG. 1A, a dummy channel structure 150 has continuous sidewall. For example, the dummy channel structure 150 has a rectangular shape or a trapezoid shape in the XZ plane. In another example (not shown), the dummy channel structure 150 can have a similar configuration to the channel structure 130. That is, the dummy channel structure 150 can include a first portion disposed in the first stack 110 of layers and a second portion extending through the second stack 120 of layers. The first portion of the dummy channel structure 150 may have a larger dimension than the second portion of the dummy channel structure 150 in a direction parallel to the main surface of the first die D1. Thus, the sidewall of the first portion has a larger perimeter than the second portion.

In some embodiments, the first die D1 may further include at least one contact structure 161 that extends from the face side of the first die D1 to the backside of the first die D1. In one example, the at least one contact structure 161 extends through a capping layer 125, a third insulating layer 163 and an etch stop layer 115, and extends into the semiconductor layer 111. In another example (not shown), the contact structure 161 extends through the first insulating layer 121 and the third insulating layer 163, and may stop at the etch stop layer 115.

In some embodiments, the first die D1 further includes a spacer layer 165 (e.g. silicon oxide) covering the semiconductor layer 111 from the backside of the first die D1. A first conductive structure 167a is disposed on the backside of the spacer layer 165, and the first conductive structure 167a is conductively connected with the semiconductor layer 111 through an opening in the spacer layer 165. A second conductive structure 167b is also disposed on the backside of the first die D1, and the second conductive structure 167b is conductively connected with the contact structure 161 through a contact that is referred to as through silicon contact. In an example, the through silicon contact is formed in an opening in the semiconductor layer 111. The opening in the semiconductor layer 111 can be lined with the spacer layer 165 on the sidewall. While not shown, it should be understood that the first conductive structure 167a and the second conductive structure 167b can be conductively connected to external circuitry.

As mentioned earlier, memory cells can be vertically stacked on the face side of the first die D1. In some embodiments, a second die D2 (not shown) can be bonded with the first die D1 face to face (a side with a majority of circuitry is face, and an opposite side to the face side is a backside). In some examples, the second die D2 includes a substrate and peripheral circuitry (e.g., address decoder, driving circuits, sense amplifier, and the like) formed on a face side of the substrate for the memory cells. Note that the first die D1 initially includes a substrate, over which the memory cells are formed, and the substrate of the first die D1 is removed prior to the formation of the first conductive structure 167a and the second conductive structure 167b in some examples.

Generally, the peripheral circuitry of the second die D2 can interface the memory cells with external circuitry. In some embodiments, the contact structure 161 is conductively connected to the peripheral circuitry of the second die D2. As a result, the peripheral circuitry can receive instructions from the external circuitry via the second conductive structures 167b and the contact structures 161, provide control signals to the memory cells, receive data from the memory cells, and output data to the external circuitry via the contact structures 161 and the second conductive structures 167b.

In some embodiments, the semiconductor device 100A can include multiple array dies (e.g. the first die D0 and a CMOS die (e.g. the second die D2). The multiple array dies and the CMOS die can be stacked and bonded together. Each array die is coupled to the CMOS die, and the CMOS die can drive the array dies individually or together in a similar manner. Further, in some embodiments, the semiconductor device 100A includes at least a first wafer and a second wafer bonded face to face. The first die D1 is disposed with other array dies like D1 on the first wafer, and the second die D2 is disposed with other CMOS dies like the second die D2 on the second wafer. The first wafer and the second wafer are bonded together so that the array dies on the first wafer are bonded with corresponding CMOS dies on the second wafer.

Figure 2:
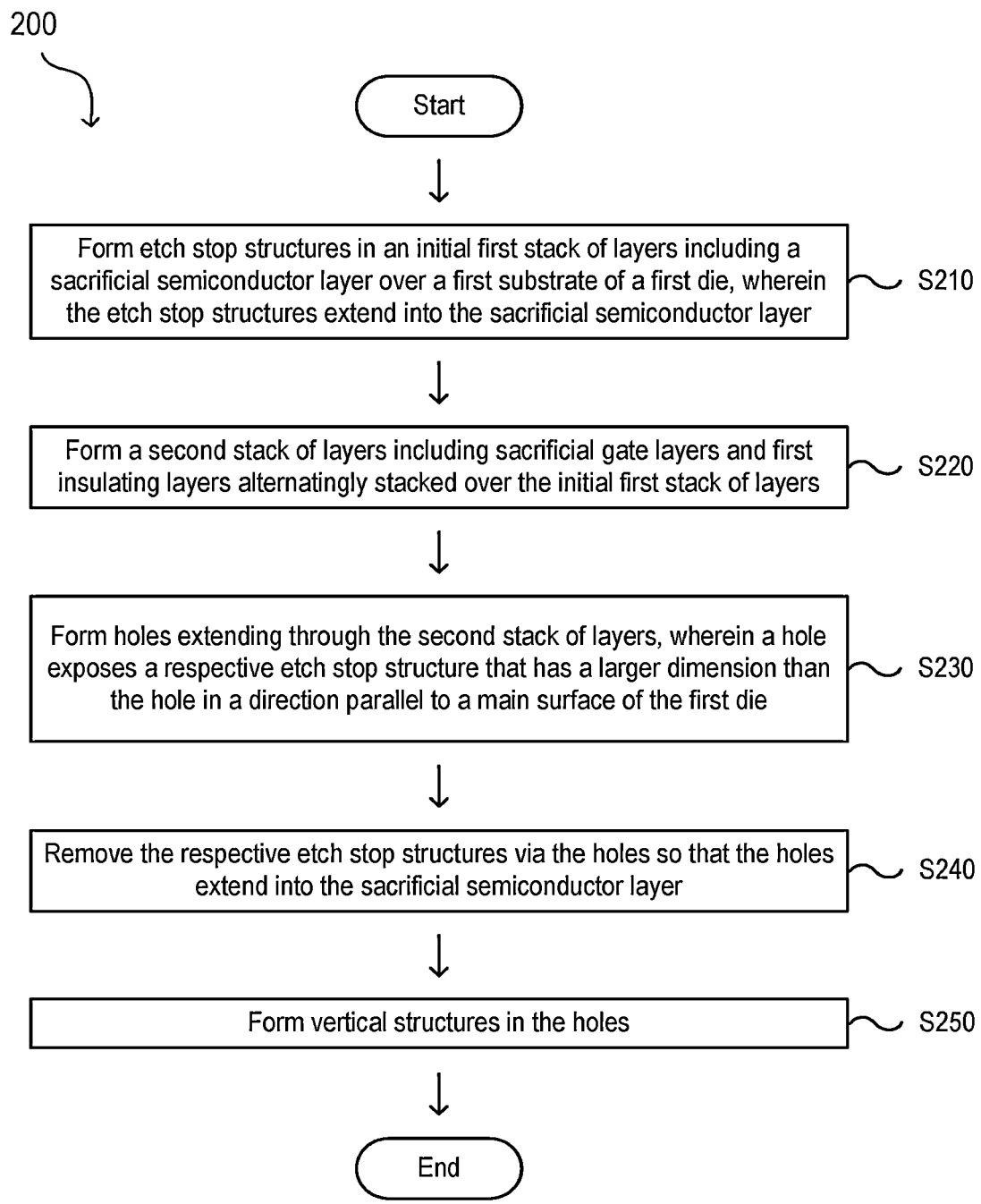
FIG. 2 shows a flow chart of an exemplary process for manufacturing an exemplary semiconductor device, in accordance with exemplary embodiments of the present disclosure.

FIG. 2 shows a flow chart of a process 200 for manufacturing an exemplary semiconductor device, such as the semiconductor device 100A and the like, in accordance with exemplary embodiments of the present disclosure. The process 200 starts with Step S210 where etch stop structures are formed in an initial first stack of layers including a sacrificial semiconductor layer over a first substrate of a first die. The etch stop structures extend into the sacrificial semiconductor layer. At Step S220, a second stack of layers is formed. The second stack of layers includes sacrificial gate layers and first insulating layers alternatingly stacked over the initial first stack of layers. At Step S230, holes (e.g. channel holes) are formed that extend through the second stack of layers and stop at the etch stop structures. A hole exposes a respective etch stop structure that has a larger dimension than the hole in a direction parallel to a main surface of the first die. At Step S240, the respective etch stop structures are removed via the holes so that the holes extend into the sacrificial semiconductor layer. At Step S250, vertical structures (e.g. the channel structure 130) are formed in the holes. It should be noted that additional steps can be provided before, during, and after the process 200, and some of the steps described can be replaced, eliminated, or performed in a different order for additional embodiments of the process 200.

In some embodiments, the initial first stack of layers can be replaced by the first stack of layers (e.g. the first stack 110 of layers) that includes, for example the semiconductor layer 111 by processing on the backside of the semiconductor device 100A.

FIGS. 3A, 3B, 3C, 3D, 3E, 3F, 3G, 3H and 3I are cross-sectional views of a semiconductor device 300 at various intermediate steps of manufacturing, in accordance with exemplary embodiments of the present disclosure. In some embodiments, the semiconductor device 300 can eventually become the semiconductor device 100A in FIGS. 1A-1B. Note that a channel structure is used herein as an example of the vertical structures for illustration purposes.

Figure 3A:
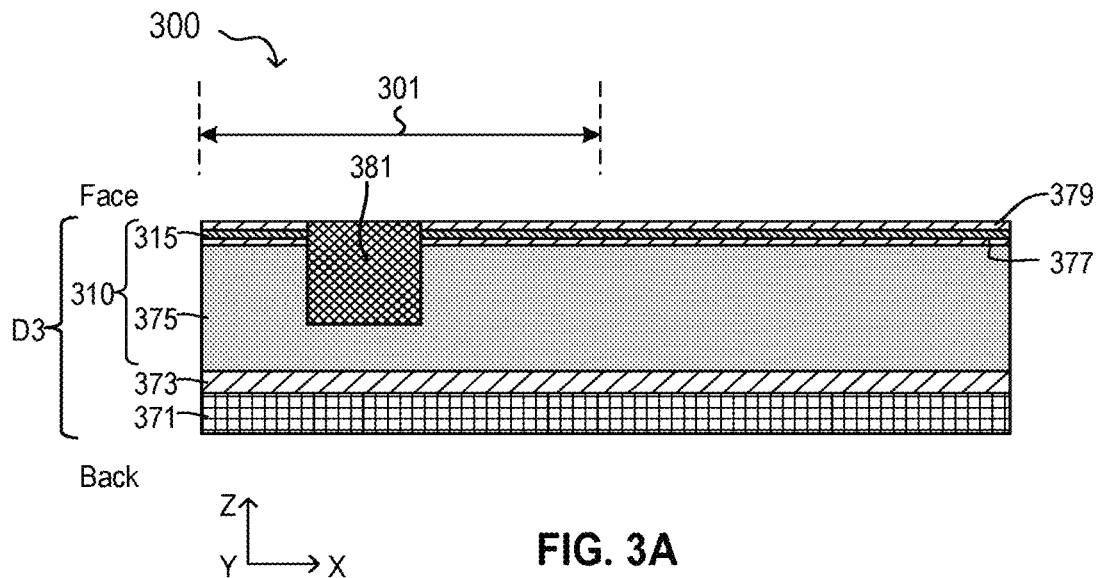
FIGS. 3A, 3B, 3C, 3D, 3E, 3F, 3G, 3H and 3I are cross-sectional views of a semiconductor device at various intermediate steps of manufacturing, in accordance with exemplary embodiments of the present disclosure.

As shown in FIG. 3A, the semiconductor device 300 includes a first die D3 having a first substrate 371. An oxide layer 373 can be disposed on the first substrate 371. The first die D3 includes an initial first stack 310 of layers including a sacrificial semiconductor layer 375 and an etch stop layer 315. The etch stop layer 315 may be sandwiched between oxide layers 377 and 379. In some embodiments, etch stop structures 381 are formed in the initial first stack 310 of layers and extend into the sacrificial semiconductor layer 375. In the example of FIG. 1A, an etch stop structure 381 is formed in a core region 301. For example, the etch stop structure 381 can be formed by forming an opening in the initial first stack 310 based on a first mask having patterns corresponding to the layout patterns 131'. Then, etch stop material, such as tungsten, can be deposited to fill the opening, and excess etch stop material, can be removed for example by chemical mechanical polishing. As will be discussed later, the etch stop structures 381 can also be formed in another region, such as a staircase region.

Note that the first die D3 can eventually become the first die D1 in FIG. 1A in some examples. Accordingly, the initial first stack 310 of layers can eventually become the first stack 110 of layers. The etch stop layer 315 can correspond to the etch stop layer 115. The core region 301 can correspond to the core region 101. Similarly, the first die D3 can include a face side and a backside (a side with a majority of circuitry is face, and an opposite side to the face side is a backside).

Figure 3B:
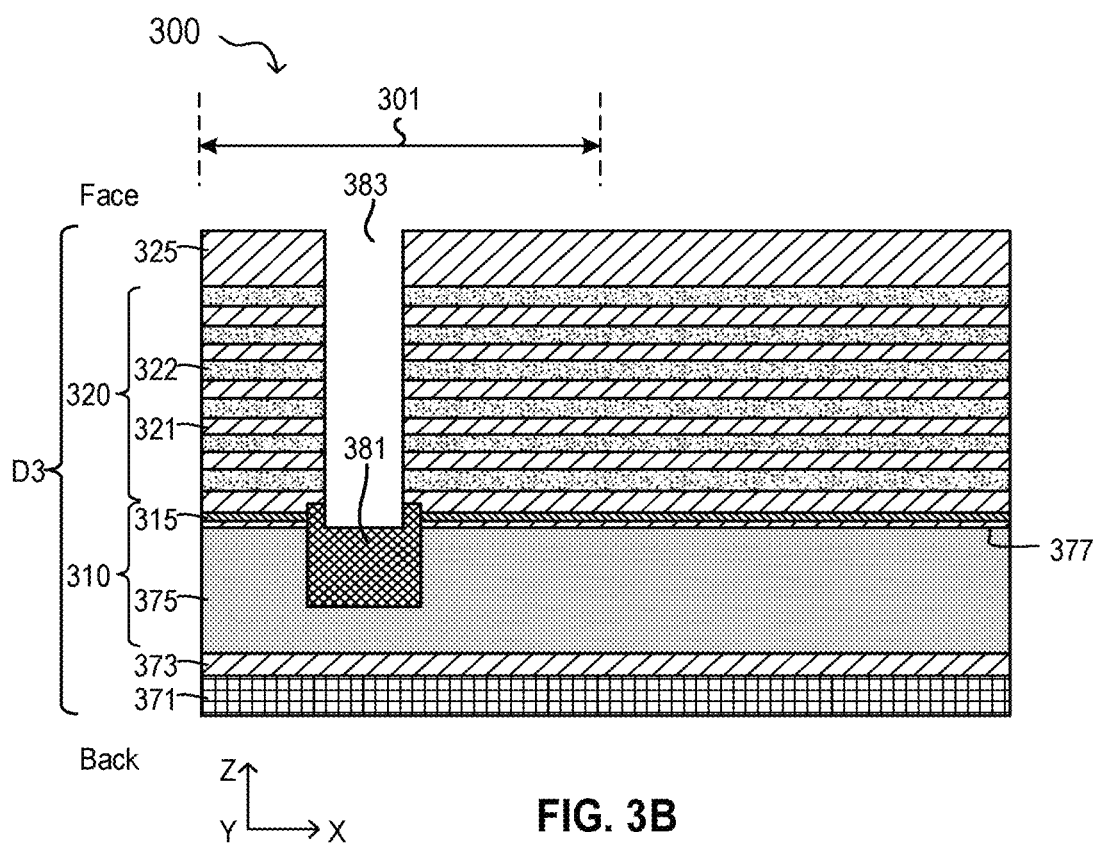

In FIG. 3B, a second stack 320 of layers is formed over the initial first stack 310 of layers. The second stack 320 of layers can include first insulating layers 321 and sacrificial gate layer 322 which are stacked alternatingly in the Z direction. A capping layer 325 can also be formed over the second stack 320 of layers. Then, channel holes 383 can be formed by etching through the second stack 320 of layers. In some examples, the channel holes 383 are formed based on a second mask having patterns corresponding to the layout patterns 132'. Each channel hole 383 can expose a respective etch stop structure 381 that has a larger dimension than the corresponding channel hole 383 in a direction parallel to a main surface of the first die D3 (e.g. the XY plane). In this example, an etch stop structure 381 can extend horizontally beyond a perimeter of a respective channel hole 383.

In some embodiments, an etch stop structure 381 has a lateral dimension of 80-200 nm in a direction parallel to the main surface of the first die D3 (e.g. the XY plane) and a thickness of 10-500 nm in a direction (e.g. the Z direction) perpendicular to the main surface of the first die D3. A respective channel hole 383 has a lateral dimension of 60-150 nm in the direction parallel to the main surface of the first die D3.

In some embodiments, the etch stop structures 381 are configured to have different etching properties from the sacrificial semiconductor layer 375 and the second stack 320 of layers so that an etching process to form the channel holes 383 can be stopped at the etch stop structures 381. In a non-limiting example, the etch stop structures 381 include tungsten. The first insulating layers 321 include silicon oxide. The sacrificial gate layers 322 include silicon nitride. The etch stop layer 315 includes polysilicon. The sacrificial semiconductor layer 375 includes poly silicon.

Further, in some embodiments, the second stack 320 of layers can eventually become the second stack 120 of layers. The first insulating layers 321 can correspond to the first insulating layers 121. The capping layer 325 can correspond to the capping layer 125.

Figure 3C:
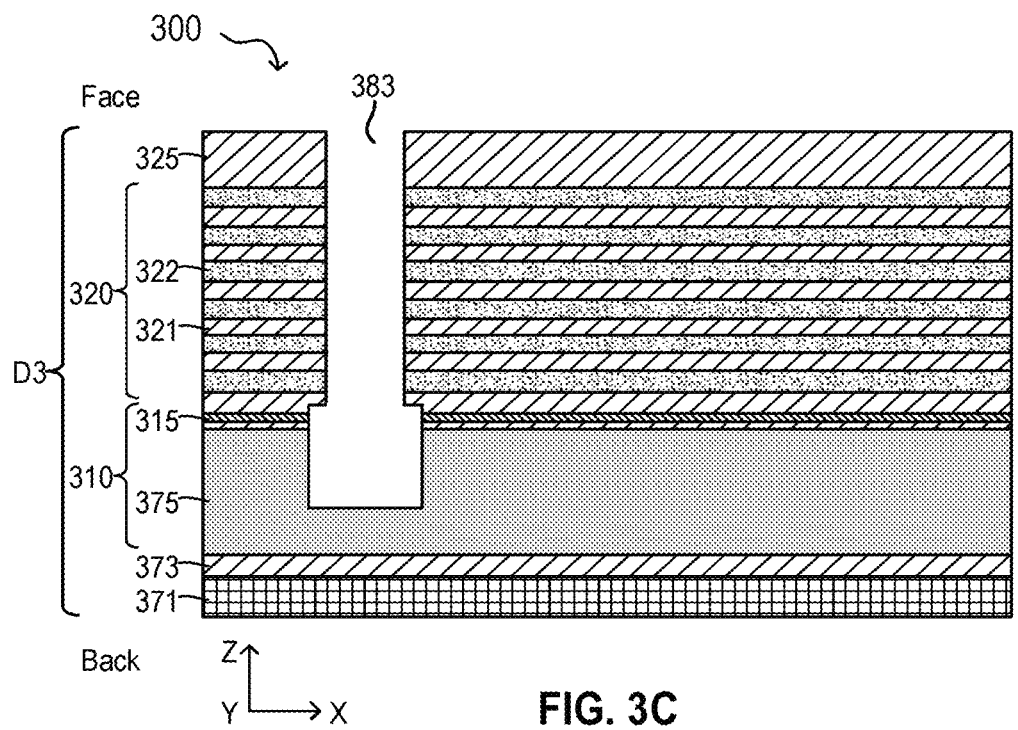

In FIG. 3C, the etch stop structures 381 are removed, for example by dry etch. As a result, the channel holes 383 extend into the initial first stack 310 of layers, particularly into the sacrificial semiconductor layer 375. The channel holes 383 thus have varying widths in a height direction (e.g. the Z direction). More importantly, the channel holes 383 can have uniform end profiles at hole bottoms.

Figure 3D:
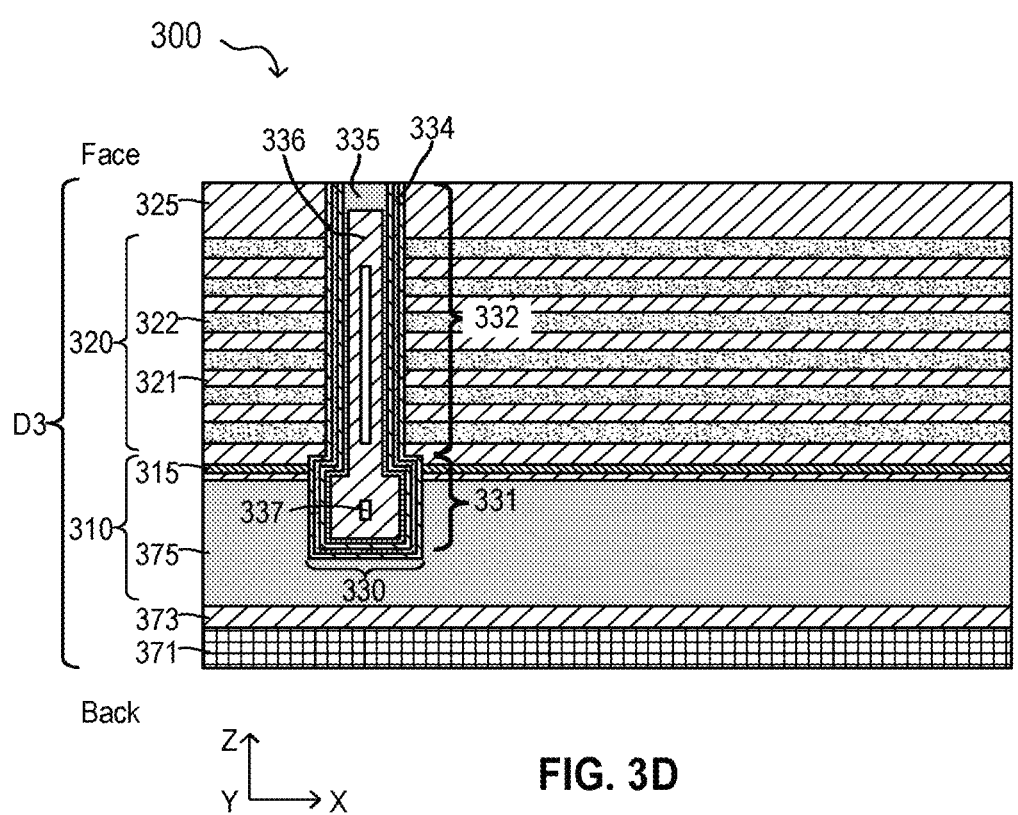

In FIG. 3D, channel structures 330 are formed in the channel holes 383. For example, second insulating layers 334 of the channel structures 330 can be formed on exposed surfaces along the channel holes 383. The second insulating layers 334 may include a tunneling layer, a charge trapping layer, and a barrier layer. Then, a channel layer 335 of the channel structures 330 can be formed along the second insulating layers 334, and a dielectric layer 336 of the channel structures 330 can be formed that is surrounded by the channel layer 335. The dielectric layer 336 may include one or more voids 337.

As shown, the channel structure 330 includes a first portion 331 disposed in the initial first stack 310 of layers and a second portion 332 extending through the second stack 320 of layers. The first portion 331 of the channel structure 330 has a larger dimension than the second portion 332 of the channel structure 330 in a direction parallel to a main surface of the first die D3 (e.g. the XY plane).

In some embodiments, the channel structures 330 can eventually become the channel structures 130. Accordingly, the first portion 331 can eventually become the first portion 131. The second portion 332 can correspond to the second portion 132. The channel layer 335 can correspond to the channel layer 135. The second insulating layers 334 can correspond to the second insulating layers 134. The dielectric layer 336 can correspond to the dielectric layer 136. The one or more voids 337 can correspond to the one or more voids 137.

In some embodiments, while not shown, the semiconductor device 300 may further include a third stack of layers over the second stack 320 of layers. The third stack of layers includes first insulating layers 121 and sacrificial gate layers 122 alternatingly stacked in the Z direction. Channel holes can also be formed by etching through the third stack and referred to as upper channel holes (UCHs). Accordingly, the channel holes 383 can be referred to as lower channel holes (LCHs). Each UCH can be aligned to a respective LCH so that a respective channel structure can be formed that extend through the second stack 230 and the third stack. The respective channel structure can include the first portion 331 of the channel structure 330 and another portion that corresponds to the second portion 332 of the channel structure 330. In one embodiment, the respective channel structure can be formed in the UCH and the LCH simultaneously. In another embodiment, part of the respective channel structure can be formed in the LCH first, before the third stack is formed and etched to form the UCH, prior to forming another part of the respective channel structure in the UCH.

Figure 3E:
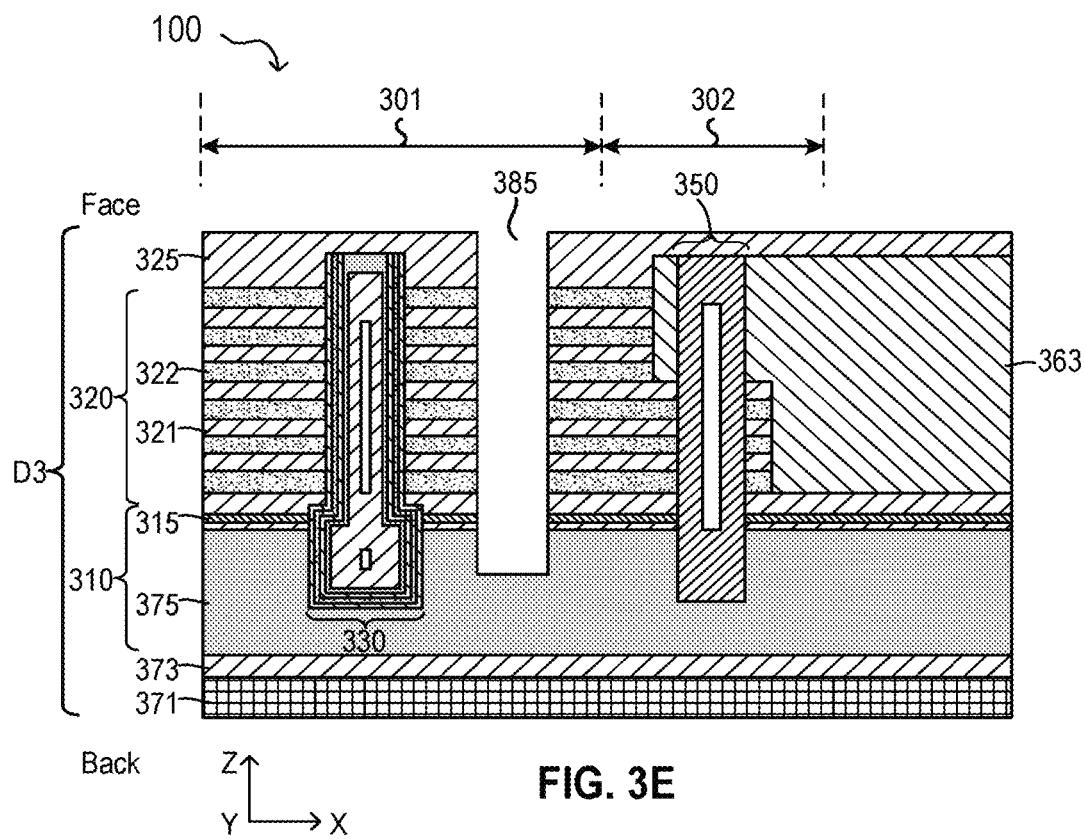

In FIG. 3E, a staircase region 302 is formed, where pairs of the first insulating layers 321 and the sacrificial gate layers 322 are arranged in a form of stair steps, for example one pair of the first insulating layer 321 and the sacrificial gate layer 322 per stair step. The staircase region 302 can be covered by a third insulating layer 363. A plurality of dummy channel structures 350 can be formed, for example in the staircase region 302. One or more gate line (GL) cut trenches 385 can be formed, for example in the core region

301. The one or more GL cut trenches 385 can be used to replace the sacrificial gate layers 322 with gate layers in a future step, and the plurality of dummy channel structures 350 can prevent the second stack 320 of layers from collapsing during such a future replacing step.

In some embodiments, the plurality of dummy channel structures 350 is formed by etching dummy channel holes (DCHs, not shown) through the second stack 320 of layers and filling the DCHs with one or more dielectric materials. In some embodiments, the etch stop structures 381 can be formed in the staircase region 302 and used for forming the dummy channel structures 350. Each DCH can expose a respective etch stop structure 381 that has a larger dimension than the corresponding DCH in a direction parallel to a main surface of the first die D3 (e.g. the XY plane). For example, an etch stop structure 381 can extend horizontally beyond a perimeter of a respective DCH. As a result, the dummy channel structures 350 can have similar configurations to the channel structures 330.

In some embodiments, the etch stop structures 381 can also be formed and used for forming the GL cut trenches 385. Each GL cut trench 385 can expose a respective etch stop structure 381 that has a larger dimension than the corresponding GL cut trench 385 in a direction parallel to a main surface of the first die D3 (e.g. the XY plane). For example, an etch stop structure 381 can extend horizontally beyond a perimeter of a respective GL cut trench 385. As a result, the GL cut trenches 385 (and future gate line slit structures formed in the GL cut trenches 385) can have similar configurations to the channel structures 330.

In some embodiments, the staircase region 302 can correspond to the staircase region 102. The dummy channel structures 350 can correspond to the dummy channel structures 150. The third insulating layer 363 can correspond to the third insulating layer 163.

Figure 3F:
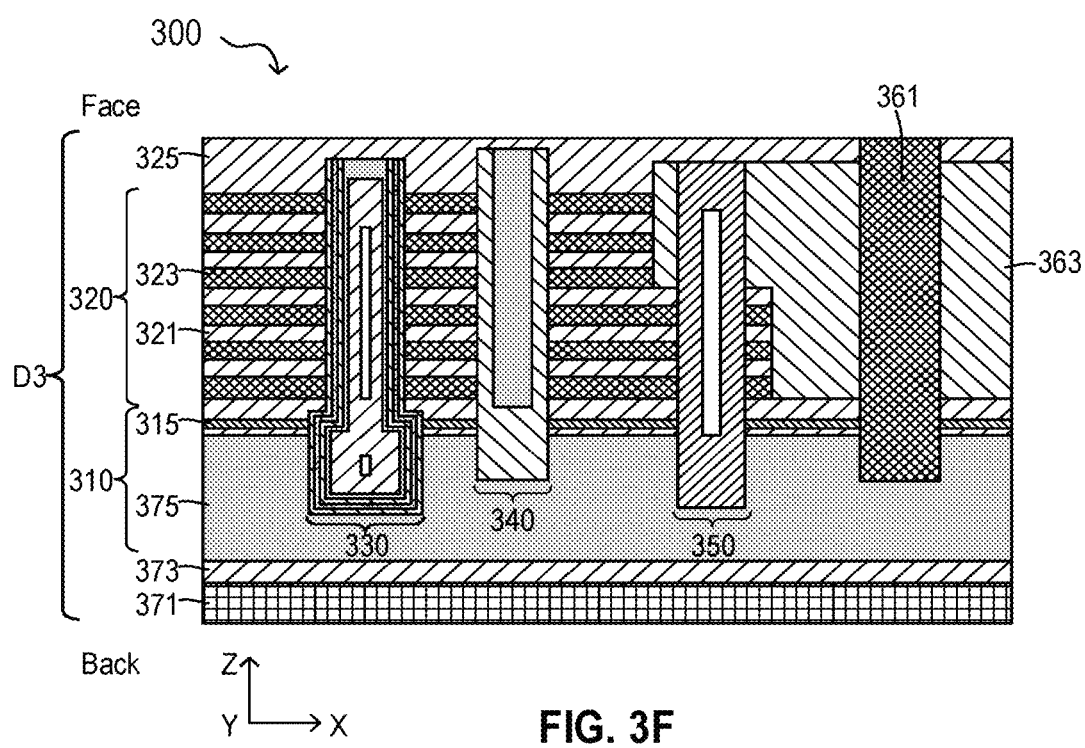

In FIG. 3F, the sacrificial gate layers 322 are replaced with gate layers 323 via the GL cut trenches 385, by etching away the sacrificial gate layers 322 and forming the gate layers 323. Then, gate line slit (GLS) structures 340 are formed in the GL cut trenches 385. Next, at least one contact structure 361 is formed that extends from the face side of the first die D3 to the backside of the first die D3. While not shown, gate contact structures can also be formed on the stair steps and be connected to the respective gate layers 323. The gate contact structures can be used to connect driving circuitry to the respective gate layers 323.

In some embodiments, the gate layers 323 can correspond to the gate layers 123. The GLS structures 340 can correspond to the GLS structures 140. The at least one contact structure 361 can correspond to the at least one contact structure 161. Similarly, the second stack 320 of gate layers 323 and first insulating layers 321 and the channel structures 330 can form a stack of transistors, such as an array of vertical memory cell strings. In some embodiments, the stack of transistors can include memory cells stacked in the Z direction.

Further, in some embodiments, a second die D4 (not shown) can be bonded to the first die D3 face to face (a side with a majority of circuitry is face, and an opposite side to the face side is a backside). The second die D4 corresponds to the second die D2. Therefore, the second D4 can include a second substrate and peripheral circuitry formed on a face side of the second substrate for the memory cells of the first die D3. Detailed descriptions have been provided above and will be omitted here for simplicity purposes.

Figure 3G:
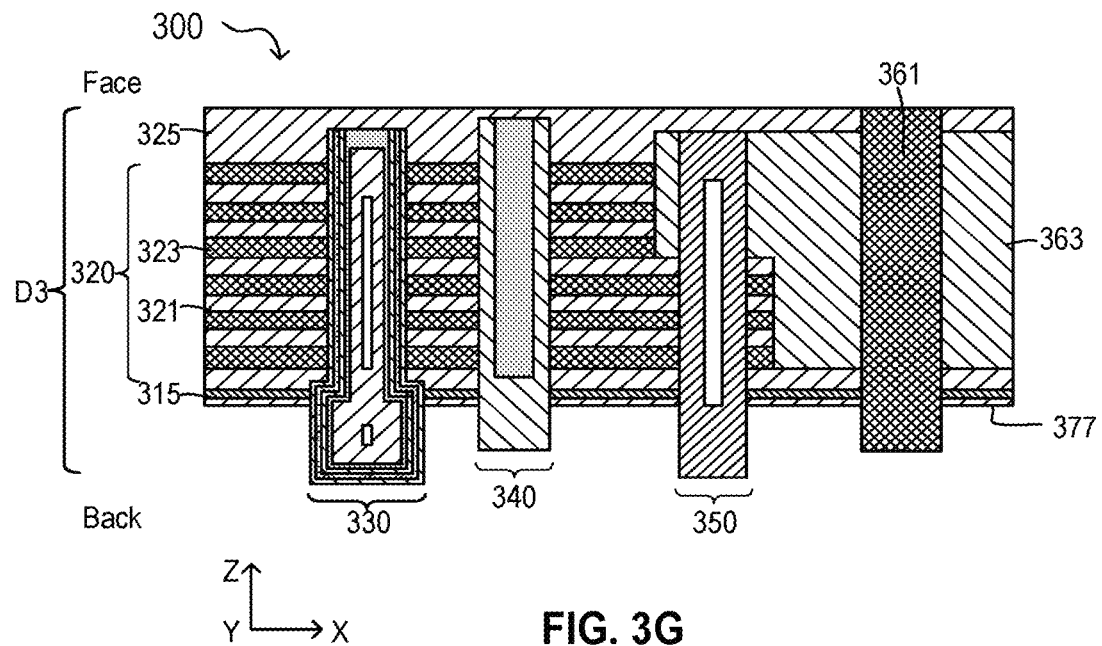

In FIG. 3G, the first substrate 371, the oxide layer 373 and the sacrificial semiconductor layer 375 are removed from the backside of the first die D3 so that the channel structures 330 are exposed from the backside of the first die D3. Particularly, the first substrate 371 can be removed by chemical-mechanical polishing (CMP). The oxide layer 373 can be etched. The sacrificial semiconductor layer 375 can be selectively etched. As a result, the GLS structures 340 and the dummy channel structures 350 can also be exposed from the backside of the first die D1. In this example, the contact structure 361 is exposed. In another example where the contact structure 361 extends through the third insulating layer 363 and stops at the etch stop layer 315, the contact structure 361 remains covered by the etch stop layer 315.

Figure 3H:
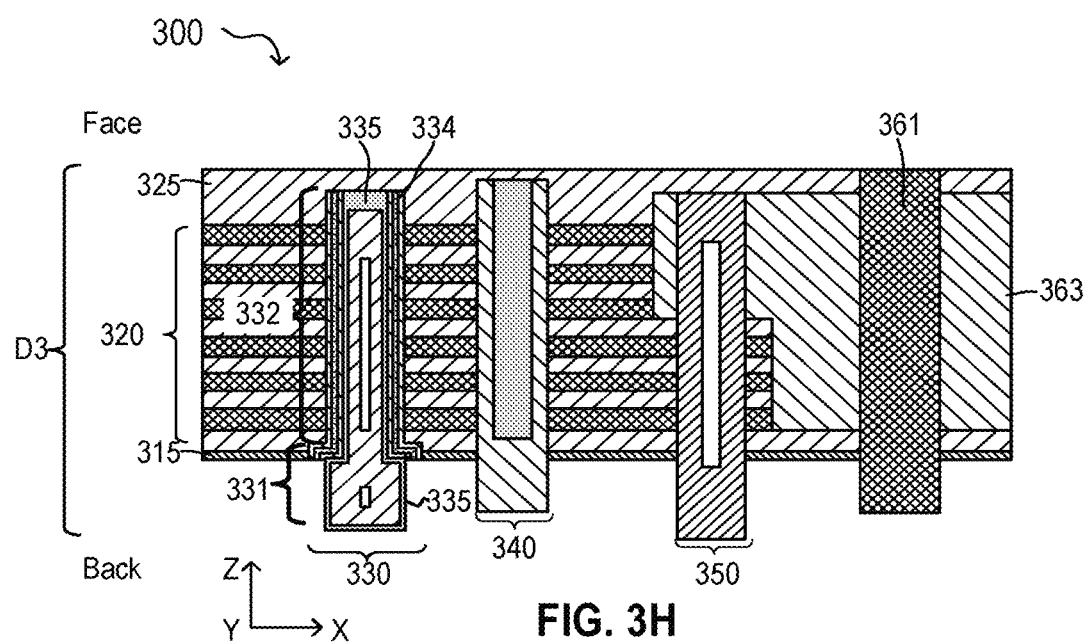

In FIG. 3H, exposed portions of the second insulating layers 334 are removed so that the channel layer 335 is exposed from the backside of the first die D3. As a result, the channel structure 330 can become the channel structure 130. Particularly, the first portion 331 can become the first portion 131. The descriptions have been provided above and will be omitted here for simplicity purposes.

In some examples, the second insulating layers 334 include a silicon oxide layer surrounded by a silicon nitride layer surrounded by another silicon oxide layer. During an etching process to remove the exposed portions of the second insulating layers 334, the oxide layer 377 can therefore also be removed.

Figure 3I:
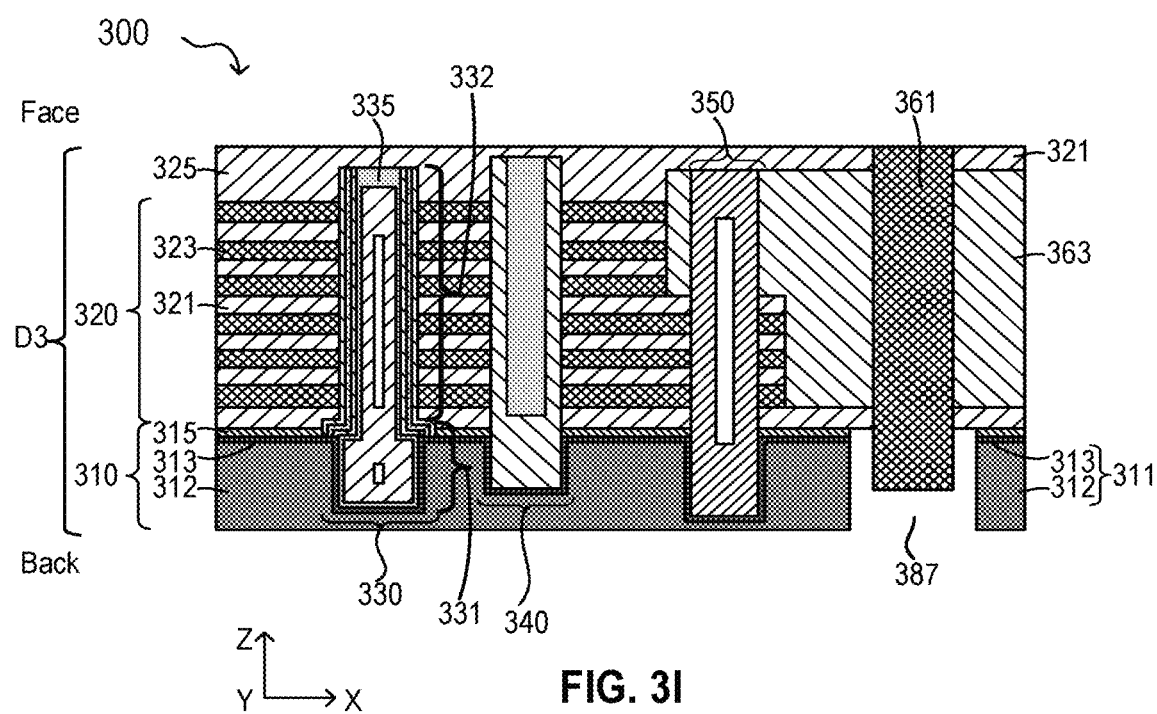

In FIG. 3I, a semiconductor layer 311 is formed that covers the channel structures 330 from the backside of the first die D3. In some embodiments, the semiconductor layer 311 can correspond to the semiconductor layer 111. In one embodiment, the semiconductor layer 311 includes a bulk portion 312 and a liner portion 313 (e.g. a conformal portion). The liner portion 313 can be formed on the channel layer 335 and doped by ion implantation. Then, the bulk portion 312 can be formed, for example by chemical vapor deposition (CVD), and planarized by CMP. The bulk portion 312 can be doped in situ during CVD or doped by ion implantation after CVD. A post-annealing step, such as laser annealing, may be executed to activate dopants and/or repair crystal damages. In another embodiment, the semiconductor layer 311 only includes the bulk portion 312 which is in contact with the channel layer 335. Accordingly, the semiconductor layer 311 can be formed by a single deposition process followed by planarization and may also go through doping and annealing processes.

Further, an opening 387 can be formed in the semiconductor layer 311 to expose the contact structure 361 from the backside of the first die D1. While not shown, a spacer layer that corresponds to the spacer layer 165 can be formed from the backside of the first die D3. A portion of the spacer layer is removed from a bottom of the opening 387 so that a remaining portion of the spacer layer covers sidewalls of the opening 387 and exposes the contact structure 361. Next, a conductive layer can be formed from the backside of the first die D3 and divided to form separate conductive structures. In one example, a first conductive structure that corresponds to the first conductive structure 167a is formed. The first conductive structure is conductively connected to the semiconductor layer 311 through an opening in the spacer layer. In another example, a second conductive structure that corresponds to the second conductive structure 167b is formed. The second conductive structure is formed from the backside of the first die D3 and is conductively connected to the contact structure 361 through the opening 387 in the semiconductor layer 311. The second conductive structure is separated from the semiconductor layer 311 by the remaining portion of spacer layer disposed on the sidewalls of the opening 387.

It is noted that the semiconductor device 100A can be suitably used in a memory system.

Figure 4:
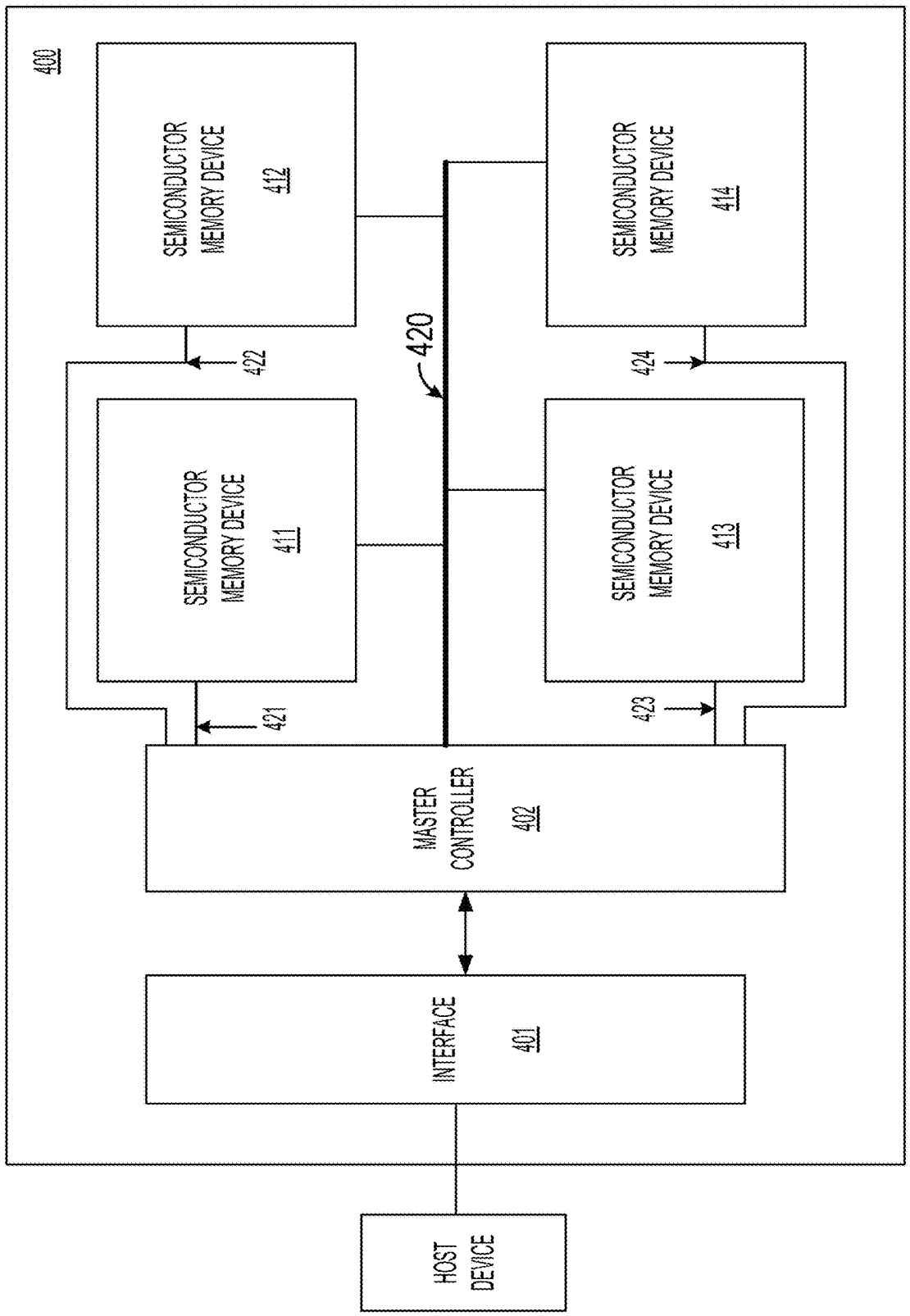
FIG. 4 shows a block diagram of a memory system device, in accordance with exemplary embodiments of the present disclosure.

FIG. 4 shows a block diagram of a memory system device 400, in accordance with exemplary embodiments of the present disclosure. The memory system device 400 includes one or more semiconductor memory devices, such as shown by semiconductor memory devices 411, 412, 413 and 414, which are respectively configured similarly to the semiconductor device 100A. In some examples, the memory system device 400 is a solid state drive (SSD).

The memory system device 400 can include other suitable components. For example, the memory system device 400 includes an interface 401 and a master controller 402 coupled together as shown in FIG. 4. The memory system device 400 can include a bus 420 that couples the master controller 402 with the semiconductor memory devices 411-414. In addition, the master controller 402 is connected with the semiconductor memory devices 411-414 respectively, such as shown by respective control lines 421, 422, 423 and 424.

The interface 401 is suitably configured mechanically and electrically to connect between the memory system device 400 and a host device, and can be used to transfer data between the memory system device 400 and the host device.

The master controller 402 is configured to connect the respective semiconductor memory devices 411-414 to the interface 401 for data transfer. For example, the master controller 402 is configured to provide enable/disable signals respectively to the semiconductor memory devices 411-414 to activate/deactivate one or more semiconductor memory devices 411-414 for data transfer.

The master controller 402 is responsible for the completion of various instructions within the memory system device 400. For example, the master controller 402 can perform bad block management, error checking and correction, garbage collection, and the like.

In some embodiments, the master controller 402 is implemented using a processor chip. In some examples, the master controller 402 is implemented using multiple microcontroller units (MCUs).

"Device" or "semiconductor device" as used herein generically refers to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first die comprising:
      a first stack of layers including a semiconductor layer on a back side of the first die;
      a second stack of layers including gate layers and first insulating layers alternatingly stacked on a face side of the first die, the face side being opposite to the back side, the second stack of layers being stacked on the first stack of layers in a first direction from the face side to the back side; and
      a vertical structure extending along the first direction through the first stack of layers and the second stack of layers, the vertical structure including a first portion and a second portion, the first portion being disposed in the first stack of layers, the second portion extending through the second stack of layers, the first portion having a different dimension than the second portion in a second direction parallel to a main surface of the first die, the second direction being perpendicular to the first direction.

2. The semiconductor device of claim 1, wherein:
   the vertical structure includes a channel structure in a core region, and
   the channel structure includes a channel layer extending in the first portion and the second portion.

3. The semiconductor device of claim 2, wherein the second portion comprises:
   a tunneling layer surrounding the channel layer;
   a charge trapping layer surrounding the tunneling layer; and
   a barrier layer surrounding the charge trapping layer.

4. The semiconductor device of claim 2, wherein the channel layer, in the first portion, is in contact with the semiconductor layer.

5. The semiconductor device of claim 2, wherein:
   the semiconductor layer is a source connection layer that is configured to connect the channel layer to an array common source.

6. The semiconductor device of claim 1, wherein the first portion has a larger dimension than the second portion in the direction parallel to the main surface of the first die.

7. The semiconductor device of claim 1, wherein a first lateral periphery of the first portion extends from a second periphery of the second portion by 10-100 nm.

8. The semiconductor device of claim 1, further comprising:
   a first conductive structure disposed on the backside of the first die, the first conductive structure conductively connected with the semiconductor layer; and a second conductive structure disposed on the backside of the first die, the second conductive structure conductively connected with a contact structure disposed on the face side of the first die.

9. The semiconductor device of claim 1, wherein the vertical structure includes at least one of a gate line slit (GLS) structure or a dummy channel structure.

10. The semiconductor device of claim 1, further comprising:
   memory cells on the face side of the first die; and
   a second die bonded with the first die face to face, the second die including a substrate and peripheral circuitry formed on a face side of the substrate for the memory cells.

11. A memory system, comprising:
   a semiconductor device, comprising:
      a die including:
         a first stack of layers including a semiconductor layer on a back side of the die;
         a second stack of layers including gate layers and insulating layers alternatingly stacked on a face side of the die, the face side being opposite to the back side, the second stack of layers being stacked on the first stack of layers in a first direction from the face side to the back side; and
         a vertical structure extending along the first direction through the first stack of layers and the second stack of layers, the vertical structure including a first portion and a second portion, the first portion being disposed in the first stack of layers, the second portion extending through the second stack of layers, the first portion having a different dimension than the second portion in a second direction parallel to a main surface of the die, the second direction being perpendicular to the first direction; and
   a controller configured to control operations of the semiconductor device, the controller being connected with the semiconductor device.

12. The memory system of claim 11, wherein:
   the vertical structure includes a channel structure in a core region, and
   the channel structure includes a channel layer extending in the first portion and the second portion.

13. The memory system of claim 12, wherein the second portion comprises:
   a tunneling layer surrounding the channel layer;
   a charge trapping layer surrounding the tunneling layer; and
   a barrier layer surrounding the charge trapping layer.

14. The memory system of claim 12, wherein the channel layer, in the first portion, is in contact with the semiconductor layer.

15. The memory system of claim 12, wherein:
   the semiconductor layer is a source connection layer that is configured to connect the channel layer to an array common source.

16. The memory system of claim 11, wherein the first portion has a larger dimension than the second portion in the direction parallel to the main surface of the first die.

17. The memory system of claim 11, wherein a first lateral periphery of the first portion extends from a second periphery of the second portion by 10-100 nm.

18. The memory system of claim 11, further comprising:
   a first conductive structure disposed on the backside of the first die, the first conductive structure conductively connected with the semiconductor layer; and
   a second conductive structure disposed on the backside of the first die, the second conductive structure conductively connected with a contact structure disposed on the face side of the first die.

19. The memory system of claim 11, wherein the vertical structure includes at least one of a gate line slit (GLS) structure or a dummy channel structure.

20. The memory system of claim 11, further comprising:
   memory cells on the face side of the first die; and
   a second die bonded with the first die face to face, the second die including a substrate and peripheral circuitry formed on a face side of the substrate for the memory cells.

* * * * *